(12) United States Patent
Kobayashi

(10) Patent No.: US 11,728,963 B2
(45) Date of Patent: Aug. 15, 2023

(54) CLOCK AND DATA RECOVERY DEVICE, MEMORY SYSTEM, AND DATA RECOVERY METHOD

(71) Applicant: KIOXIA CORPORATION, Tokyo (JP)

(72) Inventor: Hiroyuki Kobayashi, Yokohama Kanagawa (JP)

(73) Assignee: Kioxia Corporation, Tokyo (JP)

( * ) Notice: Subject to any disclaimer, the term of this patent is extended or adjusted under 35 U.S.C. 154(b) by 188 days.

(21) Appl. No.: 17/382,935

(22) Filed: Jul. 22, 2021

(65) Prior Publication Data

US 2021/0351908 A1 Nov. 11, 2021

Related U.S. Application Data

(62) Division of application No. 16/118,404, filed on Aug. 30, 2018, now Pat. No. 11,101,974.

(30) Foreign Application Priority Data

Mar. 22, 2018 (JP) .................................. 2018-054371

(51) Int. Cl.
*H04L 7/033* (2006.01)
*H03L 7/08* (2006.01)
*H03L 7/091* (2006.01)
*H04J 14/02* (2006.01)

(52) U.S. Cl.
CPC ............. *H04L 7/033* (2013.01); *H03L 7/0807* (2013.01); *H03L 7/091* (2013.01); *H04J 14/02* (2013.01)

(58) Field of Classification Search
CPC ........ H04L 7/033; H03L 7/0807; H03L 7/091; H04J 14/02
See application file for complete search history.

(56) References Cited

U.S. PATENT DOCUMENTS

| | | | |
|---|---|---|---|
| 6,061,307 A * | 5/2000 | Shimazaki | G11B 11/1051 428/819.4 |
| 7,242,635 B2 | 7/2007 | Okuda | |
| 8,283,957 B2 | 10/2012 | Sai | |
| 8,671,252 B2 * | 3/2014 | Kim | G11C 7/22 711/100 |
| 10,838,655 B2 | 11/2020 | Kobayashi et al. | |
| 11,101,974 B2 * | 8/2021 | Kobayashi | G11C 7/222 |

(Continued)

FOREIGN PATENT DOCUMENTS

JP 2007-166395 A 6/2007

*Primary Examiner* — Chi H Pham
*Assistant Examiner* — Weibin Huang
(74) *Attorney, Agent, or Firm* — Kim & Stewart LLP

(57) ABSTRACT

A clock and data recovery device of a memory system receives a multiplexed data signal obtained by multiplexing a plurality of data units, each of which is to be transmitted to one of a plurality of memories for storage therein, in an area corresponding to each memory in an amplitude direction and a time direction. The clock and data recovery device includes a clock generation circuit configured to generate a clock, and a data recovery circuit configured to execute phase synchronization with respect to a synchronization signal included in the multiplexed data signal using the generated clock and to recover one of the data units from the area corresponding to one of the memories, from the multiplexed data signal.

18 Claims, 5 Drawing Sheets

(56) References Cited

U.S. PATENT DOCUMENTS

| | | | | |
|---|---|---|---|---|
| 2004/0160692 A1* | 8/2004 | Kirby | ............... | G11B 20/1407 |
| | | | | 360/39 |
| 2007/0183552 A1* | 8/2007 | Sanders | ............... | H04L 7/033 |
| | | | | 375/376 |
| 2008/0074300 A1* | 3/2008 | Cherubini | ............... | H03M 13/1102 |
| | | | | 341/120 |
| 2009/0207957 A1* | 8/2009 | Fukuda | ............... | H04L 7/0276 |
| | | | | 375/354 |
| 2011/0051798 A1* | 3/2011 | Kojima | ............... | H04L 25/03343 |
| | | | | 375/232 |
| 2011/0208990 A1* | 8/2011 | Zerbe | ............... | G06F 1/08 |
| | | | | 710/53 |
| 2011/0243289 A1* | 10/2011 | Seol | ............... | G11C 7/222 |
| | | | | 375/371 |
| 2012/0069687 A1* | 3/2012 | Koshizuka | ............... | G11C 7/22 |
| | | | | 365/193 |
| 2015/0146830 A1* | 5/2015 | Buchmann | ............... | H04L 7/0337 |
| | | | | 375/355 |
| 2018/0005686 A1* | 1/2018 | Oh | ............... | G11C 29/52 |

* cited by examiner

FIG. 4

Downlink

| CHANNEL | CONTROLLER | BR-0 | BR-1 | BR-2 | BR-3 |
|---|---|---|---|---|---|
| BAUD RATE | TX | RX-TX | RX-TX | RX-TX | RX |
| | F0x2 | F0x2/F0x2 | F0x2/F0 | F0/F0 | F0 |
| D0 | 2'b10 | - | - | - | - |
| D1 | 2'b00 | - | - | - | - |
| D2 | 2'b10 | - | - | - | - |
| D3 | 2'b00 | - | - | - | - |

FIG. 5

Uplink

| CHANNEL | BR-3 | BR-2 | BR-1 | BR-0 | CONTROLLER |
|---|---|---|---|---|---|
| BAUD RATE | TX | RX-TX | RX-TX | RX-TX | RX |
| | F0 | F0/F0 | F0/F0x2 | F0x2/F0x2 | F0x2 |
| D0 | 2'b10 | - | - | - | - |
| D1 | - | 2'b00 | - | - | - |
| D2 | - | - | 2'b10 | - | - |
| D3 | - | - | - | 2'b00 | - |

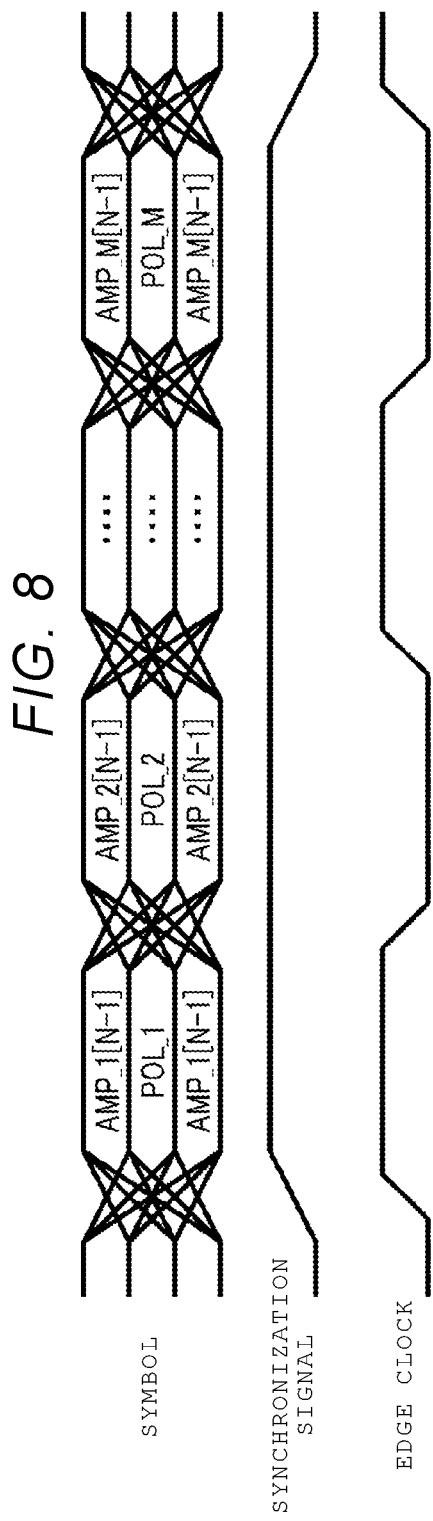

CLOCK AND DATA RECOVERY DEVICE, MEMORY SYSTEM, AND DATA RECOVERY METHOD

CROSS-REFERENCE TO RELATED APPLICATIONS

This application is a division of U.S. patent application Ser. No. 16/118,404, filed Aug. 30, 2018, which is based upon and claims the benefit of priority from Japanese Patent Application No. 2018-054371, filed Mar. 22, 2018, the entire contents of which are incorporated herein by reference.

FIELD

Embodiments described herein relate generally to a clock and data recovery device, a memory system, and a data recovery method.

BACKGROUND

In recent years, in a memory system, data may be serially transmitted between a host device and a memory. As a scheme of such serial transfer, a scheme using PAM-X data subjected to pulse-amplitude modulation (PAM) has been proposed. For example, PAM-4 data of 2-bit (4-ary value) pulse amplitude modulation type is often used as multivalued PAM-X data.

In a reception circuit or the like which receives serially transmitted PAM-4 data as input data, a clock and data recovery device, which separates and recovers a synchronization signal (clock) superimposed on a data signal of transmitted data, is used. Hereinafter, the clock and data recovery device may be referred to as a CDR device.

In a memory system of an up/down sampling daisy-chain type, for example, in a case of dividing received data into pieces of data in a time direction with four-phase clock signals, the four-phase clocks operate so as to be synchronized with a data signal transition point 1, data 1, a data signal transition point 2, and data 2, respectively. However, since there is no distinction between before and after of consecutive data, there are two phase synchronization states. For that reason, it is required to correctly receive data in the CDR device.

DESCRIPTION OF THE DRAWINGS

FIG. 4 is a diagram illustrating an example of a data structure of downlink transmission in the memory system according to the embodiment.

FIG. 5 is a diagram illustrating an example of a data structure of uplink transmission in the memory system according to the embodiment.

FIG. 8 is a diagram illustrating an example of a data structure according to a second modification example.

DETAILED DESCRIPTION

An embodiment provides a CDR device capable of receiving correct data in a case of being applied to a memory system of an up/down sampling daisy-chain type.

According to an embodiment, a clock and data recovery device of a memory system receives a multiplexed data signal obtained by multiplexing a plurality of data units, each of which is to be transmitted to one of a plurality of memories for storage therein, in an area corresponding to each memory in an amplitude direction and a time direction. The clock and data recovery device includes a clock generation circuit configured to generate a clock and a data recovery circuit configured to execute phase synchronization with respect to a synchronization signal included in the multiplexed data signal using the generated clock and to recover one of the data units from an area corresponding to one of the memories, from the multiplexed data signal.

Hereinafter, the embodiment will be described with reference to the drawings.

Configuration of Memory System

Figure 1:
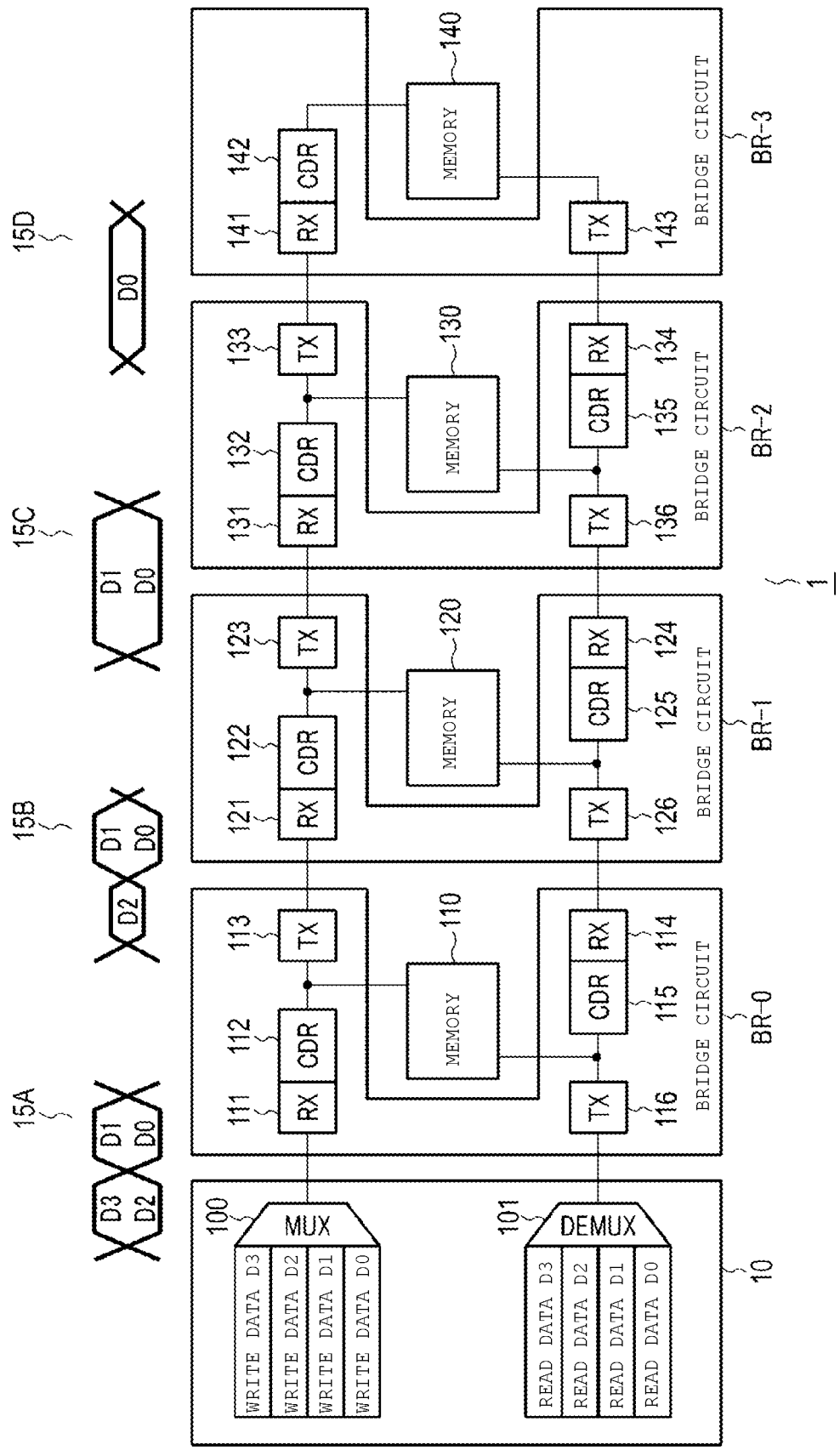
FIG. 1 is a block diagram illustrating an example of a memory system of an up/down sampling daisy-chain type according to an embodiment.

FIG. 1 is a block diagram illustrating an example of a memory system 1 of an up/down sampling daisy-chain type to which the CDR device of the embodiment is applied. As illustrated in FIG. 1, the memory system 1 includes a memory controller 10 and a plurality (four in this case) of bridge circuits BR-0 to BR-3. The bridge circuits BR-0 to BR-3 are connected to memories 110 to 140 that store data transmitted from the memory controller 10, respectively. Each of the memories 110 to 140 is, for example, a non-volatile memory such as a NAND type flash memory or a three-dimensionally structured flash memory.

The memory controller 10 communicates data to and from a host (not illustrated) such as a personal computer. The memory controller 10 includes a multiplexer (MUX) 100 and a demultiplexer (DEMUX) 101, and executes communication of data with each of the bridge circuits BR-0 to BR-3.

The bridge circuit BR-0 is a circuit for controlling reading and writing of data from and into the memory 110, and includes reception circuits (RX) 111 and 114, CDR devices 112 and 115, and transmission circuits (TX) 113 and 116.

The bridge circuit BR-1 is a circuit for controlling reading and writing of data from and into the memory 120, and includes reception circuits (RX) 121 and 124, CDR devices 122 and 125, and transmission circuits (TX) 123 and 126.

The bridge circuit BR-2 is a circuit for controlling reading and writing of data from and into the memory 130, and includes reception circuits (RX) 131 and 134, CDR devices 132 and 135, transmission circuits (TX) 133 and 136.

The bridge circuit BR-3 is a circuit for controlling reading and writing of data from and into the memory 140, and includes a reception circuit (RX) 141, a CDR device 142, and a transmission circuit (TX) 143.

In the memory system 1 of the up/down sampling daisy-chain type according to the embodiment, the memory controller 10 transmits multiplexed data (may be referred to as "write symbol") obtained by multiplexing data (write data D3 to D0) in units of 1-bit, for example, to be written to the memories 110 to 140 respectively connected to the bridge circuits BR-0 to BR-3.

That is, the multiplexer 100 of the memory controller 10 multiplexes 4-bit write data D3 to D0 as a write symbol 15A. In other words, the multiplexer 100 of the embodiment generates 4-ary value PAM-4 data including 2-bit information in one time slot as multiplexed data and transmits the multiplexed data.

The write symbols 15A to 15D illustrate transitions of the transmitted write symbol in the memory system 1. In the embodiment, write data D3 to D0 included in the multiplexed data are subsequently stored in the memories 110 to 140, respectively. That is, as the multiplexed data transmitted from the memory controller 10 are subsequently transmitted from the bridge circuit BR-0 to the bridge circuits BR-1, BR-2, and BR-3, a data amount of multiplexed data decreases.

The write symbol 15A has areas for 2-bit data in an amplitude direction and 2-bit data in a time direction. Four areas are respectively allocated in advance to the memories 110 to 140. In other words, the four areas correspond to the bridge circuits BR-0 to BR-3 or the memories 110 to 140, respectively.

For example, at the time of activation of the memory system 1, the memory controller 10 transmits an ID (chip/channel ID) that can be identified for each bridge circuit to each of the bridge circuits BR-0 to BR-3. Each of the bridge circuits BR-0 to BR-3 can identify the area (more specifically, data position) of write data included in the write symbol allocated to the bridge circuit of the memory system in advance, according to the transmitted ID. With this, each of the bridge circuits BR-0 to BR-3 fetches one of 1-bit write data D3 to D0 from the area allocated to each of the bridge circuits BR-0 to BR-3 in the transmitted write symbols 15A to 15D and stores fetched 1-bit write data in each corresponding memory of the memories 110 to 140.

Hereinafter, an operation of each of the bridge circuits BR-0 to BR-3 will be described. First, as described above, the memory controller 10 multiplexes and transmits 4-bit write data D3 to D0 as the write symbol 15A by the multiplexer 100.

In the bridge circuit BR-0, the reception circuit 111 receives the write symbol 15A from the memory controller 10. Here, as described above, the bridge circuit BR-0 includes the CDR device 112 of the embodiment. The CDR device 112 fetches 1-bit write data D3 of the area allocated by the ID in advance and stores the 1-bit write data D3 in the memory 110. The CDR device 112 extracts the write data D3 with a synchronization signal included in the write symbol 15A as a reference, and delivers the write symbol 15A from which the write data D3 is extracted and the synchronization signal to the transmission circuit 113.

The transmission circuit 113 removes the write data D3 from the write symbol 15A with the received synchronization signal as a reference to generate a write symbol 15B. That is, the write symbol 15B includes write data D2, D1, and D0 which are allocated to the memories 120 to 140 in advance. Here, the transmission circuit 113 transmits the write symbol 15B to the bridge circuit BR-1 by including the synchronization signal received from the CDR device 112 in the write symbol 15B.

The bridge circuit BR-1 executes the same operation as that of the bridge circuit BR-0. That is, the reception circuit 121 receives the write symbol 15B from the bridge circuit BR-0. The bridge circuit BR-1 includes the CDR device 122 having the same configuration as that of the CDR device 112 of the embodiment. The CDR device 122 fetches 1-bit write data D2 from the area allocated by the ID in advance and stores the 1-bit write data D2 in the memory 120. The CDR device 122 extracts the write data D2 with the synchronization signal included in the write symbol 15B as a reference, and delivers the write symbol 15B from which the write data D2 is extracted and the synchronization signal to the transmission circuit 123.

The transmission circuit 123 removes the write data D2 from the write symbol 15B the received synchronization signal as a reference to generate the write symbol 15C. That is, the write symbol 15C includes write data D1 and D0 which are allocated to the memories 130-140 in advance. Here, the data amount of the write symbol 15C is reduced in the time direction as compared with the write symbol 15B. The transmission circuit 123 transmits the write symbol 15C including the synchronization signal received from the CDR device 122 to the bridge circuit BR-2.

The bridge circuit BR-2 executes the same operation as that of the bridge circuits BR-0 and BR-1. That is, the reception circuit 131 receives the write symbol 15C from the bridge circuit BR-1. The bridge circuit BR-2 includes the CDR device 132 having the same configuration as that of the CDR devices 112 and 122 of the embodiment. The CDR device 132 fetches 1-bit write data D1 from the area allocated by the ID in advance and stores the 1-bit write data D1 in the memory 130. The CDR device 132 extracts write data D1 with the synchronization signal included in the write symbol 15C as a reference and delivers the write symbol 15C from which the write data D1 is extracted and the synchronization signal to the transmission circuit 133.

The transmission circuit 133 removes the write data D1 from the write symbol 15C with the received synchronization signal as a reference to generate the write symbol 15D. That is, the write symbol 15D includes the write data D0 allocated to the memory 140 in advance. Here, the data amount of the write symbol 15D is reduced in the amplitude direction as compared with the write symbol 15C. The transmission circuit 133 transmits the write symbol 15D including the synchronization signal received from the CDR device 132 to the bridge circuit BR-3.

The bridge circuit BR-3 executes a reception operation similar to that of the bridge circuits BR-0 to BR-2. That is, the reception circuit 141 receives the write symbol 15D from the bridge circuit BR-2. The bridge circuit BR-3 includes the CDR device 142 having the same configuration as that of the CDR devices 112, 122, and 132 of the embodiment. The CDR device 142 fetches 1-bit write data D0 from the area allocated by the ID in advance and stores the 1-bit write data D0 in the memory 140. The CDR device 142 extracts write data D0 with the synchronization signal included in the write symbol 15D as a reference. In the embodiment, the bridge circuit BR-3 has a configuration in which a transmission circuit corresponding to each of the transmission circuits 113, 123, and 133 of the bridge circuits BR-0 to BR-2 is not included.

As described above, in the memory system 1 of the up/down sampling daisy-chain type according to the embodiment, the write symbol is transmitted from the memory controller 10 to each of the bridge circuits BR-0 to BR-3 by downlink. Each of the bridge circuits BR-0 to BR-3 extracts and removes write data of the allocated area from each write data multiplexed as the write symbol and stores the write data in each of the memories 110 to 140. Data transmission from the bridge circuits BR-0 to BR-3 to the memory controller 10 by uplink will be described later.

Configuration of CDR Device

Figure 2:
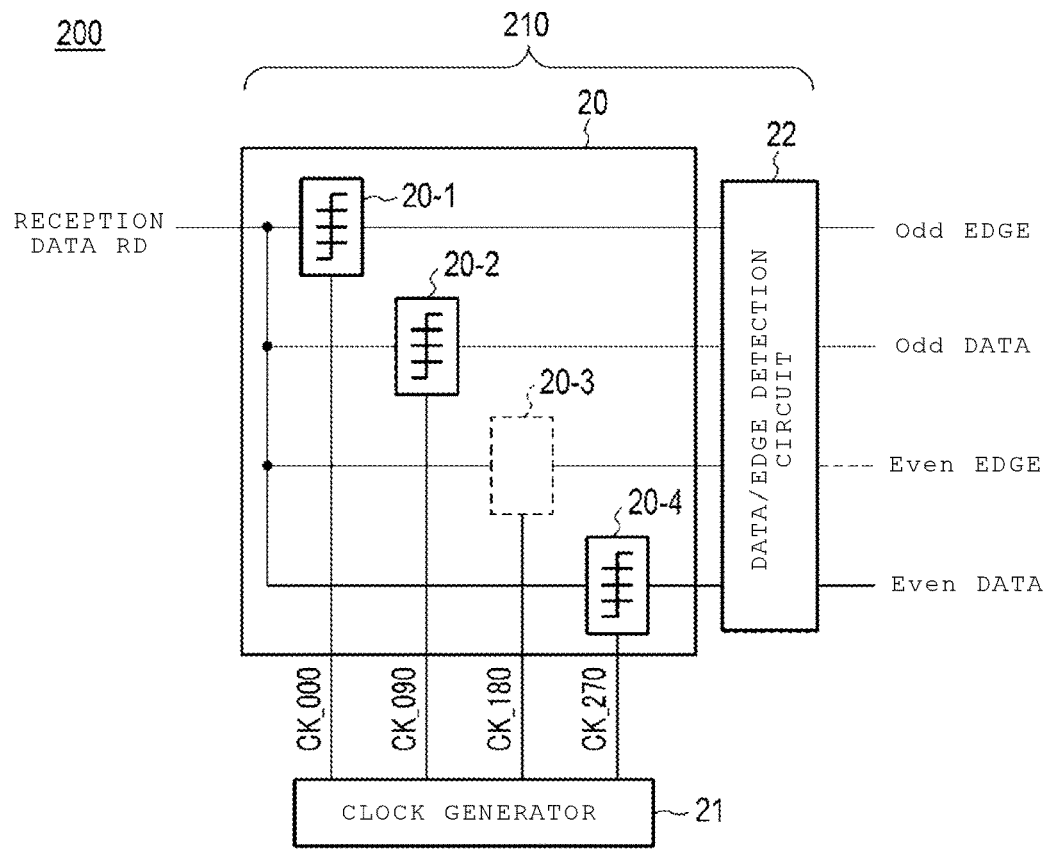
FIG. 2 is a block diagram for explaining an example of a CDR device according to the embodiment.

FIG. 2 is a diagram illustrating a configuration of a CDR device of the embodiment. A CDR device 200 of the embodiment is applied to the CDR devices 112, 122, 132, and 142 included respectively in the bridge circuits BR-0 to BR-3. The embodiment relates mainly to a configuration of a data/edge sampler 210 and a clock generator 21 provided in the CDR device 200, and description of other configurations will be omitted.

As illustrated in FIG. 2, the CDR device 200 of the embodiment includes the data/edge sampler 210 including comparators 20 (20-1 to 20-4) and a data/edge detection circuit 22, and a clock generator 21. The data/edge detection circuit 22 detects edge information and data information from reception data RD based on a phase comparison determination result of the comparator 20. As described above, the reception data RD includes the synchronization signal and corresponds to the write symbols 15A to 15D obtained by multiplexing the write data D3 to D0.

The comparator 20 receives the reception data (corresponding to multiplexed data) RD received by each of the reception circuits 111, 121, 131, and 141, executes a phase comparison with a plurality of clocks from the clock generator 21, and outputs a comparison result. The clock generator 21 outputs four-phase clocks CK_000 to CK_270. The CK_000 has a phase difference of 0 degree, and the clocks CK_090, CK_180, and CK_270 have phase differences of 90 degrees, 180 degrees, and 270 degrees, respectively, with the clock CK_000 as a reference. In the comparator 20, the comparator 20-1 executes the phase comparison with respect to the clock CK_000. In the embodiment, as will be described later, the comparator 20-3 does not perform the phase comparison with respect to the clock CK_180. When the phase error is sufficiently small, the comparators 20-2 and 20-4 receive data in synchronization with the clocks CK_090 and CK_270, respectively.

As described above, in the memory system 1 of the up/down sampling daisy-chain type, each reception circuit receives the write symbol transmitted thereto as the reception data RD. The write symbol includes a synchronization signal for extracting each piece of write data D3 to D0. The CDR device 200 extracts each piece of the write data in synchronization with a phase of the synchronization signal. In this case, the CDR device 200 synchronizes with an edge of a predetermined clock and extracts the synchronization signal.

In general, in the data/edge sampler 210 using the four-phase clocks CK_000 to CK_270, for detection of the data signal transition point of the reception data RD, the phase comparison is performed with respect to the clocks CK_000 and CK_180 having phase differences of 0 degree and 180. That is, the data/edge detection circuit 22 outputs Odd edge information corresponding to the edge of the clock CK_000 based on the determination result of the comparator 20-1. The data/edge detection circuit 22 outputs Even edge information corresponding to the edge of the clock CK_180 based on the determination result of the comparator 20-3.

In the data/edge sampler 210 using the four-phase clocks, two synchronization states occur for the reception data RD having two data signal transition points. In the memory system 1 of the up/down sampling daisy-chain type, the CDR devices 112, 122, 132, and 142 included respectively in the bridge circuits BR-0 to BR-31 extract write data from the allocated area in each write data multiplexed as the write symbol.

Figure 3:
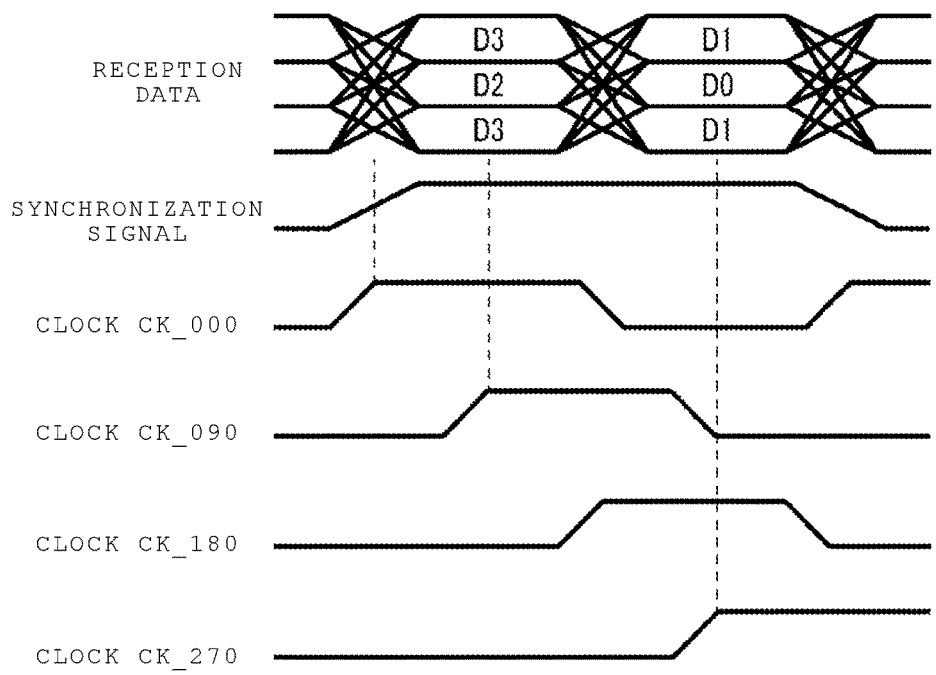
FIG. 3 is a diagram for explaining an operation of the CDR device according to the embodiment.

However, the CDR device 200 of the embodiment executes initial synchronization using only Odd edge information corresponding to the edge of the clock CK_000 which is a base point of data. That is, the CDR device 200 of the embodiment has a configuration in which a function of the comparator 20-3 is stopped and Even edge information corresponding to the edge of the clock CK_180 is not generated. As illustrated in FIG. 3, the CDR device 200 synchronizes with the edge of the clock CK_000 and extracts the synchronization signal.

The data/edge detection circuit 22 outputs Odd edge information corresponding to the edge of the clock CK_000 based on the determination result of the comparator 20-1. The data/edge detection circuit 22 outputs Odd data corresponding to the edge of the clock CK_090 having a phase difference of 90 degrees, based on the determination result of the comparator 20-2. With this, as illustrated in FIG. 3, for example, the CDR device 112 provided in the bridge circuit BR-0 can extract write data D3 from the write symbol 15A. Similarly, the CDR device 122 provided in the bridge circuit BR-1 can extract write data D2 from the write symbol 15B.

The CDR device 132 provided in the bridge circuit BR-2 can extract write data D1, which is Even data corresponding to the edge of the clock CK_270 having a phase difference of 270 degrees, from the write symbol 15C, based on the determination result of the comparator 20-4. Similarly, the CDR device 142 included in the bridge circuit BR-3 can extract write data D0 from the write symbol 15D.

FIG. 4 is a diagram illustrating a data structure of a write symbol transmitted by the memory controller 10 to each of the bridge circuits BR-0 to BR-3 by downlink, in the memory system 1 of the up/down sampling daisy-chain type according to the embodiment. FIG. 4 illustrates data to be transmitted by the controller to each of the bridge circuits BR-0 to BR-3 by downlink at the time of synchronization and a symbol rate (symbols per second, which is also known as baud rate) in reception (RX) and transmission (TX) in each bridge circuit by using the symbol rate F0 in the TX of the bridge circuit BR-3 as a reference. For example, in the bridge circuit BR-1, necessary data is extracted by receiving data at twice the symbol rate (F0x2) and then, the extracted data is transmitted at a symbol rate which is a half of F0, which means that downsampling is performed in the time direction. "2'b10" of write data D0 and D2 is a data signal of a repetitive pattern such as "1010 . . . ". "2'b00" of the write data D1 and D3 is a data signal of any other pattern. With such a data structure, since there is an alternate pattern of unit periods divided in the time direction, each CDR device can reliably perform phase synchronization. Here, the alternate pattern is a data pattern in which data of 1-bit or 2-bit alternately occurs every unit period divided in the time direction.

Referring back to FIG. 1, data transmission by uplink from each of the bridge circuit BR-0 to BR-3 to the memory controller 10 in the memory system 1 of the up/down sampling daisy-chain type according to the embodiment will be described.

Through uplink data transmission, the memory controller 10 receives a read symbol transmitted from the bridge circuit BR-0. The read symbol is multiplexed data obtained by multiplexing each read data of 1-bit read from each of the memories 110 to 140 and includes the write symbol 15A including write data D3 to D0 of 4-bit.

The memory controller 10 fetches read data D3 to D0 of 1-bit unit from the area allocated to each memory 110 to 140 in advance from the received read symbol, by the demultiplexer 101. The memory controller 10 transmits read data D3 to D0 to the host (not illustrated). Hereinafter, a process of transmitting the read symbol to the memory controller 10 will be described.

First, in the bridge circuit BR-3, the transmission circuit 143 generates a read symbol (corresponding to 15D) storing the read data D0 read from the memory 140 with the synchronization signal as a reference. As described above, the synchronization signal transmitted from the transmission circuit 133 may be used, or the synchronization signal may be individually generated. The transmission circuit 143 transmits the read symbol including the read data D0 and the synchronization signal to the bridge circuit BR-2.

In the bridge circuit BR-2, the reception circuit 134 receives the read symbol from the bridge circuit BR-3. The CDR device 135 extracts the synchronization signal based on the read data D0 included in the read symbol and transmits the synchronization signal and the read data D0 to the transmission circuit 136. The transmission circuit 136 generates a read symbol (corresponding to 15C) storing read data D1 and read data D0 read from the memory 130 with the received synchronization signal as a reference. The transmission circuit 136 transmits the read symbol including the synchronization signal to the bridge circuit 12.

In the bridge circuit BR-1, the reception circuit 124 receives the read symbol from the bridge circuit 13. The CDR device 125 extracts the synchronization signal based on the read data D0 and D1 included in the read symbol and transmits the synchronization signal and the read data D0 and D1 to the transmission circuit 126. The transmission circuit 126 generates the read symbol (corresponding to 15B) storing read data D2 from the memory 120 and the read data D0 and D1 at the half rate of the received read data D0 and D1 with the received synchronization signal as a reference. The transmission circuit 126 transmits the read symbol including the synchronization signal to the bridge circuit BR-0. Here, the CDR device 125 oscillates at twice the frequency and causes the RX side to operate at one half of the frequency and the TX side to operate at the oscillation frequency. However, each of the RX and TX may be configured to operate at a required symbol rate.

In the bridge circuit BR-0, the reception circuit 114 receives the read symbol from the bridge circuit BR-1. The CDR device 115 extracts the synchronization signal based on the read data D0, D1, and D2 included in the read symbol, and transmits the synchronization signal and the read data D0, D1, and D2 to the transmission circuit 116. The transmission circuit 116 generates a read symbol (corresponding to 15A) storing read data D3 and read data D0, D1, and D2 read from the memory 110 with the received synchronization signal as a reference. The transmission circuit 116 transmits the read symbol including the synchronization signal to the memory controller 10.

The CDR device 200 of the embodiment illustrated in FIG. 2 is also applied to the CDR devices 115, 125, and 135 respectively provided in the bridge circuits BR-0 to BR-3.

FIG. 5 is a diagram illustrating a data structure of a read symbol transmitted from each of the bridge circuits BR-0 to BR-3 to the memory controller 10 by uplink. In uplink data transmission, the symbol rate of the transmission circuit 126 (TX) to the reception circuit 124 (RX) is doubled in the bridge circuit BR-1. In the bridge circuit BR-1, the memory controller 10 synchronizes with the phase of the transmission signal from the bridge circuit BR-2 in order to generate a transmission signal with which the memory controller 10 can be synchronized. Next, the bridge circuit BR-1 stores the signal of the data D2 at a predetermined data position and thus, a synchronization signal with which the memory controller 10 can be synchronized is generated in the transmission circuit 126. With this, in the bridge circuit BR-1, a read symbol (corresponding to 15B) in which the read data D2 read from the memory 120 is arranged at a correct position is generated. That is, FIG. 5 is intended to allow all the connected bridge circuits BR-0 to BR-3 to synchronize with each other at the correct phase positions in the memory system 1 illustrated in FIG. 1 and illustrates a data structure when a synchronization signal with which all the bridge circuits BR-0 to BR-3 can be synchronized is generated.

As described above, related to the embodiment, in the memory system 1 of the up/down sampling daisy-chain type, in a case where the write symbol in which each write data is multiplexed is transmitted from the memory controller 10 to each bridge circuit, it is possible to reliably extract corresponding write data in each bridge circuit by using the CDR device of the embodiment.

In the embodiment, the write symbol and the read symbol each constitute one symbol in two time slots, and PAM-4 data which transmits information of a maximum of 2 bits in one time slot is applied. That is, the PAM-4 data has areas of write data and read data of 2 bits in the amplitude direction and write data and read data of 2 bits in the time direction. Each bridge circuit can reliably extract write data from the area to which the write symbol is allocated and store the write data in each memory, by using the CDR device of the embodiment. The CDR device of the embodiment can also be applied to a case where a read symbol in which each read data is multiplexed is transmitted from each bridge circuit to the memory controller.

In the embodiment, a configuration in which an area storing each write data (or each read data) in the amplitude direction and the time direction in a write symbol (or read symbol) using PAM-4 that transmits 2-bit information in one time slot has been described, but the embodiment is not limited thereto. That is, the embodiment can be applied even in a case of using another multivalued (X-ary value) PAM-X. A configuration in which data is stored only in the area in any of the amplitude direction and the time direction of the write symbol (or read symbol) may be adopted. Furthermore, an example in which 1-bit data as unit data for each bridge circuit is stored in the area of a write symbol (or read symbol) has been described, but is not limited to 1-bit data, for example, 2-bit data may be stored in the area.

First Modification Example

Figure 6:
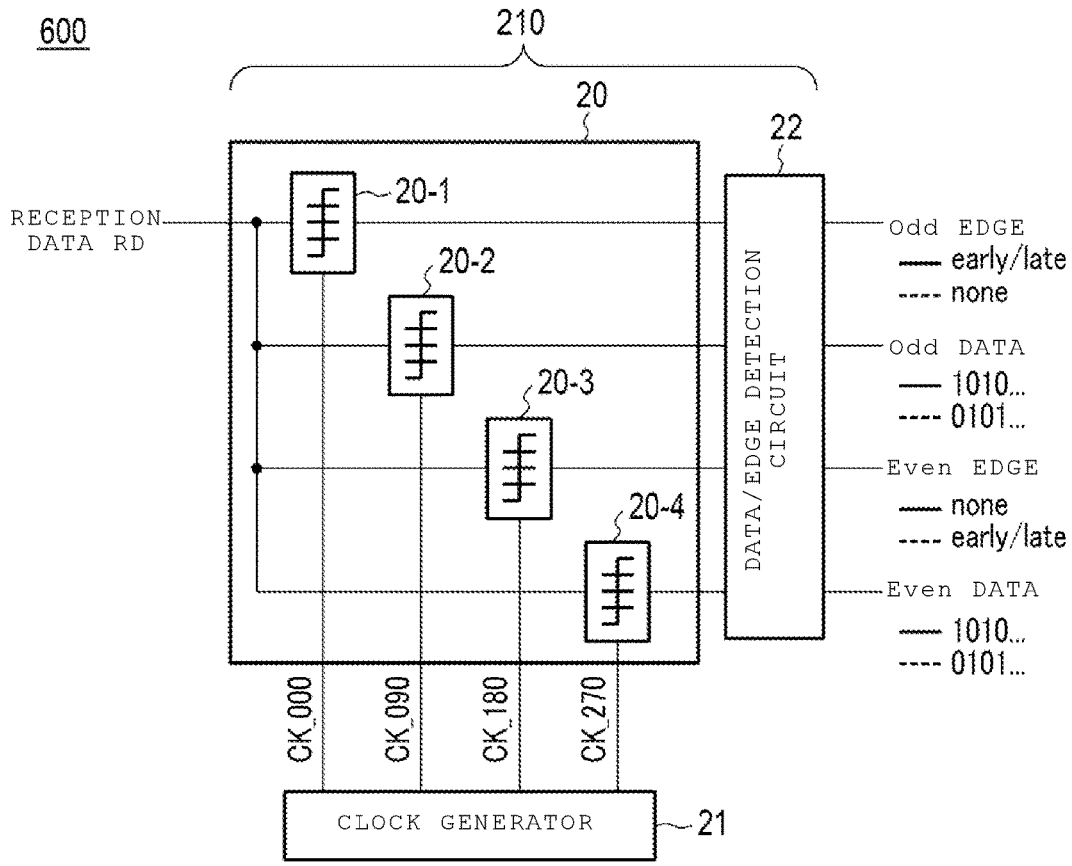
FIG. 6 is a block diagram for explaining an example of a CDR device according to a first modification example.

FIG. 6 is a block diagram for describing an example of a CDR device 600 related to a first modification example of the embodiment. A configuration of the CDR device 600 related to the first modification example is the same as that of the CDR device 200 illustrated in FIG. 2 except that the comparator 20-3 is functioning and thus, the same reference numerals are given to the same components and description thereof will be omitted. The first modification example will be described by using downlink in the bridge circuit BR-0 as an example.

In the CDR device 600 of the first modification example, the comparator 20 receives reception data (corresponding to multiplexed data) RD received by the reception circuit 111 of the bridge circuit BR-0 as an input, executes a phase comparison with a plurality of clocks from the clock generator 21, and outputs the comparison result. The clock generator 21 includes a clock CK_000 having a phase difference of 0 degree, and outputs four-phase clocks CK_000 to CK_270 having phase differences of 90 degrees, 180 degrees, and 270 degrees with the clock CK_000 as a reference, respectively. In the comparator 20, the comparators 20-1 and 20-3 perform the phase comparison on the clocks CK_000 and CK_180, respectively. When the phase error is sufficiently small, the comparators 20-2 and 20-4 receive data in synchronization with the clocks CK_090 and CK_270, respectively.

Figure 7:
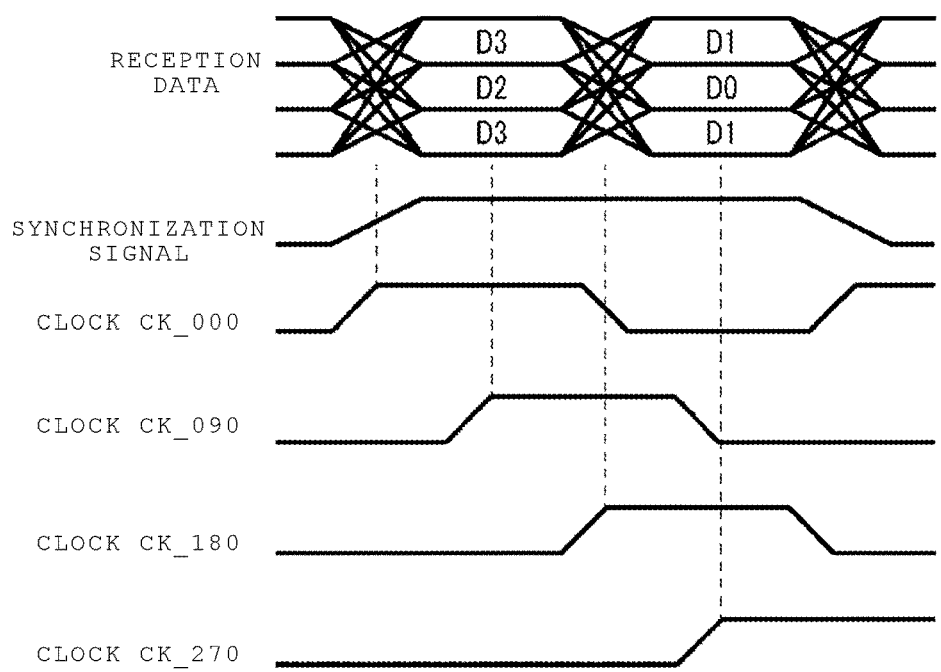
FIG. 7 is a diagram for explaining an operation of the CDR device according to the first modification example.

Here, as illustrated in FIG. 7, the reception data are a write symbol transmitted from the memory controller 10, as described above. The write symbol includes the synchronization signal for extracting each piece of write data D3 to D0 from the multiplexed data. The CDR device 600 extracts each write data in synchronization with a phase of the synchronization signal. In this case, the CDR device 600 synchronizes with an edge of a clock determined in advance and extracts the synchronization signal. The clock CK_000 is in an ideal synchronization state.

The data/edge detection circuit 22 outputs Odd edge information corresponding to the edge of a clock CK_000 based on the determination result of the comparator 20-1. The data/edge detection circuit 22 outputs Odd data corresponding to the edge of a clock CK_090 of 90 degrees based on the determination result of the comparator 20-2. Here, Odd data are data D2 and D3. The data/edge detection circuit 22 outputs Even edge information corresponding to the edge of a clock CK_180 of 180 degrees based on the determination result of the comparator 20-3. Furthermore, the data/edge detection circuit 22 outputs Even data corresponding to the edge of a clock CK_270 of 270 degrees based on the determination result of the comparator 20-4. Here, Even data are data D0 and D1.

Here, the CDR device of the first modification example confirms the presence/absence of Odd edge information and Even edge information from the data/edge detection circuit 22. In a case where Odd edge information and Even edge information for detecting only the data signal transition can be confirmed at the time of initial synchronization, the CDR device generates phase error information (early/late) for adjusting the phase of a corresponding clock, and in a case where the Odd edge information and Even edge information cannot be confirmed, the CDR device treats it as no edge information (none). In a case where Odd edge information is acquired at the rising edge of the clock CK_000 and Even edge information is acquired at the falling edge when synchronizing with the synchronization signal as illustrated in FIG. 7, in a case where the synchronization signal as illustrated in FIG. 7 is used, edge information is not output at either edge because the signal transition of data does not occur. That is, whether, for the clock CK_000 illustrated in FIG. 7, synchronization is made at one of inverted waveforms of the clock CK_000 can be determined by comparing output information of the edge or data output. With this, the CDR device 600 specifies a position of data by comparing Odd edge information with Even edge information or Odd data with Even data. Accordingly, the CDR device 600 specifies the data position to be extracted from the reception data RD based on the confirmed Odd edge information and Even edge information.

At the time of initial synchronization, the CDR device 600 specifies the position (allocated area described above) of the output data based on the comparison of the Odd data and the even data, which are alternate data output from the data/edge detection circuit 22 and outputs the position of the output data. Here, the alternate data are data in which data of 1-bit or 2-bit alternately occurs every unit period divided in the time direction. Here, the Odd data are data D2 and D3, and the Even data are data D0 and D1. In this case, if the Odd data and the Even data coincide with data in the area allocated to the memories 110 to 140 in advance (for example, data D2, D3 which are Odd data), reception data are received as it is. On the other hand, if the Odd data and the Even data are different from the data, the position of the output data are replaced, and the data position which is the area of the data D0 and D1 which is Even data, for example, is determined. Here, it is possible to treat data D2 and data D0 as polarity data, and data D3 and data D1 as amplitude data. In this case, it is possible to achieve phase synchronization by considering only the transition of the polarity data for unit period data.

As described above, even in a case where the CDR device 600 of the first modification example is applied, the CDR device 112 provided in the bridge circuit BR-0 can extract the write data D3 from the reception data. Similarly, the CDR device 122 provided in the bridge circuit BR-1 can extract the write data D2 from the reception data. The CDR device 132 provided in the bridge circuit BR-2 can extract the write data D1. Similarly, the CDR device 142 provided in the bridge circuit BR-3 can extract the write data D0.

Second Modification Example

FIG. 8 is a diagram for explaining a data structure and a synchronization detection method of a CDR device according to a second modification example of the embodiment. In the second modification example, the memory system 1 illustrated in FIG. 1 is applied to a memory system in which N×M bridge circuits are connected in cascade. N and M are any integers of 1 or more.

In the second modification example, as illustrated in FIG. 8, multiplexed data (e.g., write symbol/read symbol) transmitted to each bridge circuit by the memory controller is M symbols using PAM-N which is N-level value pulse amplitude modulation. M×N pieces of data are represented by data positions in bit units as unit data to be transmitted to each of connected bridge circuits of M×N stages. The data of N-level value is composed of polarity data of 1-bit and N−1 bit amplitude data, and each unit data is composed of M pieces of polarity data POL_1 to POL_M and N−1 bit data AMP_1 to AMP_M.

In a case where M symbols having such a data structure are transmitted to each bridge circuit, the CDR device provided in each bridge circuit detects the data signal transition synchronized with the synchronization clock, at the time of initial synchronization for determining the data position for extracting corresponding unit data. At the time of initial synchronization, the CDR device executes phase adjustment to align the phases of the synchronization clock so that the data values of the amplitude data AMP_1 to AMP_M are 0 and the data patterns of the polarity data POL_1 to POL_M become the same.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory system comprising:
a controller circuit configured to generate a multiplexed data signal obtained by multiplexing a plurality of data units in an amplitude direction and a time direction, wherein each of the data units is to be stored in one of a plurality of memories, and is multiplexed into an area of the multiplexed data signal corresponding to the memory in which the data unit is to be stored;

a plurality of memory circuits connected serially along a transmission path of the multiplexed data signal, each of the memory circuits including a corresponding one of the memories; and a plurality of clock and data recovery devices each including:
- a clock generation circuit configured to generate a clock signal, and
- a data recovery circuit configured to:
  - execute phase synchronization with respect to a synchronization signal included in the multiplexed data signal by detecting a first edge in the multiplexed data signal using the generated clock signal, and
  - determine a position of the area corresponding to one of the memories in the time direction of the multiplexed data signal based on the first edge and recover one of the data units from the area corresponding to said one of the memories, from the multiplexed data signal.

2. The memory system according to claim 1, wherein the data recovery circuit is further configured to extract the synchronization signal and detect the first edge in the multiplexed data signal for adjusting a phase of the synchronization signal, and execute the phase synchronization using the first edge as a base point of the multiplexed data signal.

3. The memory system according to claim 2, wherein the data recovery circuit executes the phase synchronization without using a second edge in the multiplexed data signal that follows the first edge.

4. The memory system according to claim 2, wherein the data recovery circuit executes the phase synchronization using a second edge in the multiplexed data signal that follows the first edge.

5. The memory system according to claim 1, wherein
the clock generation circuit is configured to generate four-phase clock signals having phases different from each other, and
the data recovery circuit is configured to detect edges and positions of areas corresponding to the memories in the multiplexed data signal using the four-phase clock signals.

6. The memory system according to claim 5, wherein the four-phase clock signals include:
a first clock signal used to detect the first edge in the multiplexed data signal,
a second clock signal used to detect a first position in the multiplexed data signal,
a third clock signal used to detect a second edge in the multiplexed data signal, and
a fourth clock signal used to detect a second position in the multiplexed data signal.

7. The memory system according to claim 6, wherein
the first position is detected when a first or a second predetermined repetitive data pattern is detected after the first edge has been detected, and
the second position is detected when the first or the second predetermined repetitive data pattern is detected after the second edge has been detected.

8. The memory system according to claim 7, wherein
the memory circuits include first, second, third, and fourth memory circuits respectively including first, second, third, and fourth memories, and
the data units include first, second, third, and fourth data units to be stored in the first, second, third, and fourth memories, respectively.

9. The memory system according to claim 8, wherein
the first data unit is extracted when the first predetermined repetitive data pattern is detected after the first edge has been detected,
the second data unit is extracted when the second predetermined repetitive data pattern is detected after the first edge has been detected,
the third data unit is extracted when the first predetermined repetitive data pattern is detected after the second edge has been detected, and
the fourth data unit is extracted when the second predetermined repetitive data pattern is detected after the second edge has been detected.

10. A data recovery method applied to a memory system that generates a multiplexed data signal obtained by multiplexing a plurality of data units in an amplitude direction and a time direction, wherein each of the data units is to be stored in one of a plurality of memories, and is multiplexed into an area of the multiplexed data signal corresponding to the memory in which the data unit is to be stored, and includes a plurality of memory circuits connected serially along a transmission path of the multiplexed data signal, each of the memory circuits including a corresponding one of the memories, the method comprising:
generating a clock signal;
executing phase synchronization with respect to a synchronization signal included in the multiplexed data signal by detecting a first edge in the multiplexed data signal using the generated clock signal; and
determining a position of the area corresponding to one of the memories in the time direction of the multiplexed data signal based on the first edge and recovering one of the data units from the area corresponding to said one of the memories, from the multiplexed data signal.

11. The data recovery method according to claim 10, further comprising:
extracting the synchronization signal and detecting the first edge in the multiplexed data signal for adjusting a phase of the synchronization signal, wherein
the phase synchronization is executed using the first edge as a base point of the multiplexed data signal.

12. The data recovery method according to claim 11, wherein the phase synchronization is executed without using a second edge in the multiplexed data signal that follows the first edge.

13. The data recovery method according to claim 11, wherein the phase synchronization is executed using a second edge in the multiplexed data signal that follows the first edge.

14. The data recovery method according to claim 10, further comprising:
generating four-phase clock signals having phases different from each other; and
detecting edges and positions of areas corresponding to the memories in the multiplexed data signal using the four-phase clock signals.

15. The data recovery method according to claim 14, wherein the four-phase clock signals include:
a first clock signal used to detect the first edge in the multiplexed data signal,
a second clock signal used to detect a first position in the multiplexed data signal,
a third clock signal used to detect a second edge in the multiplexed data signal, and
a fourth clock signal used to detect a second position in the multiplexed data signal.

16. The data recovery method according to claim 15, wherein
- the first position is detected when a first or a second predetermined repetitive data pattern is detected after the first edge has been detected, and
- the second position is detected when the first or the second predetermined repetitive data pattern is detected after the second edge has been detected.

17. The data recovery method according to claim 16, wherein
- the memory circuits include first, second, third, and fourth memory circuits respectively including first, second, third, and fourth memories, and
- the data units include first, second, third, and fourth data units to be stored in the first, second, third, and fourth memories, respectively.

18. The data recovery method according to claim 17, wherein
- the first data unit is extracted when the first predetermined repetitive data pattern is detected after the first edge has been detected,
- the second data unit is extracted when the second predetermined repetitive data pattern is detected after the first edge has been detected,
- the third data unit is extracted when the first predetermined repetitive data pattern is detected after the second edge has been detected, and
- the fourth data unit is extracted when the second predetermined repetitive data pattern is detected after the second edge has been detected.

* * * * *